United States Patent
Ma et al.

(10) Patent No.: US 6,483,308 B1
(45) Date of Patent: Nov. 19, 2002

(54) METHOD AND APPARATUS FOR PROCESSING MRI DATA ACQUIRED WITH A PLURALITY OF COILS USING DIXON TECHNIQUES

(75) Inventors: Jingfei Ma, Waukesha, WI (US); Guosheng Tan, Waukesha, WI (US); Saban Kurucay, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/652,744

(22) Filed: Aug. 31, 2000

(51) Int. Cl.[7] ................................................. G01V 3/00
(52) U.S. Cl. ..................... 324/312; 324/307; 324/309
(58) Field of Search ................................ 324/312, 307, 324/309

(56) References Cited

U.S. PATENT DOCUMENTS

| | | | |
|---|---|---|---|
| 4,825,162 A | 4/1989 | Roemer et al. | 324/318 |
| 5,144,235 A | 9/1992 | Glover et al. | 324/309 |
| 5,399,970 A | 3/1995 | Pelc et al. | 324/309 |
| 5,633,585 A | 5/1997 | Kuhn | 324/307 |
| 5,759,152 A | 6/1998 | Felmlee et al. | 600/410 |
| 6,016,057 A | 1/2000 | Ma | 324/309 |
| 6,091,243 A | 7/2000 | Xiang et al. | 324/307 |

OTHER PUBLICATIONS

The NMR Phased Array, Mag. Reson. In Med. 16, 192–225 (1990), Roemer, et al.

*Primary Examiner*—Edward Lefkowitz
*Assistant Examiner*—Dixomara Vargas
(74) *Attorney, Agent, or Firm*—Quarles & Brady LLP

(57) ABSTRACT

Three MRI acquisitions are performed to acquire data from which separate water and fat images may be reconstructed using a three-point Dixon technique. The NMR data is acquired with a phased array coil having four separate coil elements. Low resolution images are reconstructed from the acquired NMR data sets and used to calculate phase corrections which are used to correct reconstructed high resolution images. The corrected high resolution images are processed using the Dixon technique to produce fat and water images for each coil element which are combined into a single fat and a single water image.

13 Claims, 3 Drawing Sheets

METHOD AND APPARATUS FOR PROCESSING MRI DATA ACQUIRED WITH A PLURALITY OF COILS USING DIXON TECHNIQUES

BACKGROUND OF THE INVENTION

The field of the invention is nuclear magnetic resonance imaging methods and systems. More particularly, the invention relates to the use of multiple element surface coils and the reconstruction of images from MRI data acquired with such coils.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins, and after the excitation signal $B_1$ is terminated, this signal may be received and processed to form an image.

The NMR signal is typically received by a whole-body coil which is an integral part of the MRI system. However, in many applications the NMR signals are not strong and smaller coils which can be placed closer to the region of interest ("ROI") are used. Indeed, a multiple element ("phase array") surface coil, or multicoil, is often used around a region of interest (e.g., thorax, head, abdomen, extremity) to increase the image signal-to-noise ratio (S/N). Reconstruction of the raw data from the "N" separate coil elements is typically achieved by a standard method in which a magnitude image is reconstructed from each separate coil element signal, and the resulting N images are then combined to form a composite image. This combined phased array magnitude reconstruction, or "sum of squares" technique, provides up to 90% of the maximum available S/N. However, this technique requires N separate two-dimensional Fourier transforms (2DFT) and magnitude calculation operations to produce the composite image.

Materials other than water, principally fat, are found in biological tissue and have different gyromagnetic ratios. The Larmor frequency of protons in fat is offset approximately 203 Hz. from that of protons in water in a 1.5 Tesla polarizing magnetic field $B_0$. The difference between the Larmor frequencies of such different species of the same nucleus, viz., protons, is termed chemical shift, reflecting the differing chemical environments of the two species.

Often it is desired to "decompose" the NMR image into its several chemical shift components. In the exemplary case of protons, which will be used hereafter for illustration, it may be desired to portray as separate images the water and fat components of the subject. One method of accomplishing this is to acquire two images $S_0$ and $S_{-1}$ with the fat and water components of the images in phase, and out of phase by $\pi$ radians, respectively (the "Dixon" technique). Adding and subtracting these images provides separate fat and water images. The phase shift between the fat and water components of the images may be controlled by timing the RF pulses of the NMR sequence so that the signal from the fat image evolves in phase with respect to the water by the proper angle of exactly $\pi$, before the NMR signal is acquired.

In the ideal case above, the frequency of the RF transmitter is adjusted to match the Larmor frequency of the water. If the polarizing magnetic field $B_0$ is uniform, this resonance condition is achieved through out the entire subject. Similarly, the out-of-phase condition ($\pi$ radians) for the fat component is achieved for all locations in the subject under homogeneous field conditions. In this case, the decomposition into the separate images is ideal in that fat is completely suppressed in the water image, and vice versa.

When the polarizing field is inhomogeneous, however, there are locations in the subject for which the water is not on resonance. In this case, the accuracy of the decomposition breaks down and the water and fat images contain admixtures of the two species. Field inhomogeneities may result from improper adjustment or shimming of the polarizing magnetic field $B_0$, but are more typically the result of "demagnetization" effects caused by the variations in magnetic susceptibility of the imaged tissue, which locally distort the polarizing magnetic field $B_0$. These demagnetization effects may be of short spatial extent but of conventional linear or higher order shimming techniques.

The influence of demagnetization may be accommodated, however, by a three-point Dixon imaging technique that uses three acquired images $S_0$, $S_1$ and $S_2$, with the phase evolution times adjusted so that the fat and water components of the images are in phase, out of phase by $\pi$, and out of phase by $-\pi$ respectively. The complex pixels in each of the three images after conventional reconstruction may be processed as described, for example, in U.S. Pat. No. 5,144,235 to produce a separate water and a separate fat image.

In order to achieve robust and reliable water and fat separation, Dixon techniques employ extensive data processing for removing phase errors in the images. The robustness and the reliability of the Dixon method used can be compromised by the low SNR of the starting images. In addition, the processing time is significantly longer than conventional image reconstruction. These problems are exacerbated in imaging with phased array coils since the processing time is proportional to the number of coils N used, and the individual images acquired with phase array coils generally contain regions of very low SNR.

SUMMARY OF THE INVENTION

The present invention is a method for reconstructing an image from the NMR signals produced by a multicoil system using the "Dixon" technique. More particularly, multiple Dixon image acquisitions are performed using a multiple element coil; a set of low resolution images and a set of high resolution images are reconstructed; the low resolution images are employed to calculate phase corrections that are made to the high resolution images; the corrected high resolution images are processed to form a set of water images; and the water images are combined into a single water image. The corrected high resolution images may also be processed to form a set of fat images which may be combined into a single fat image.

GENERAL DESCRIPTION OF THE INVENTION

Figure 1:
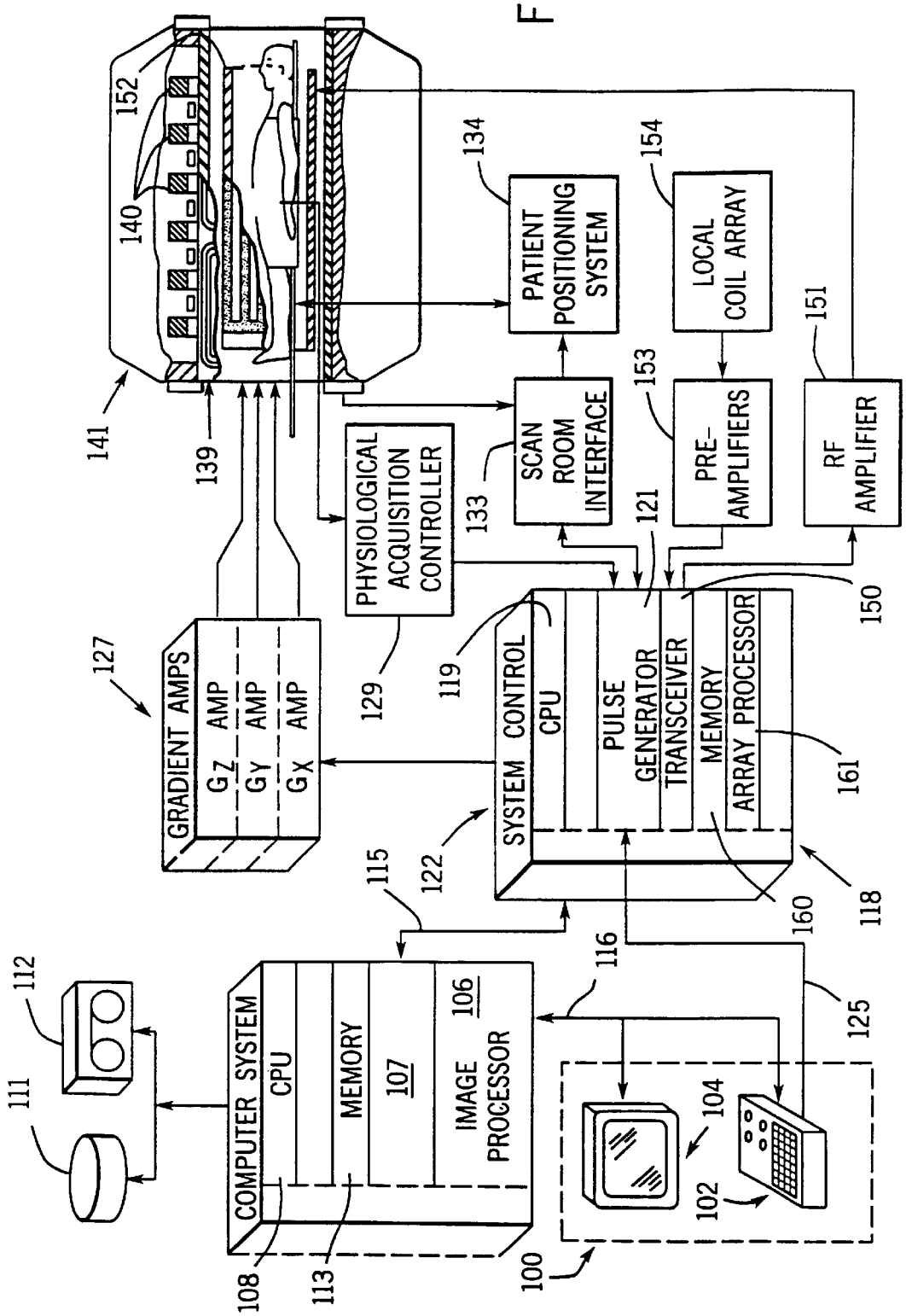
FIG. 1 is a block diagram of an MRI system which employs the present invention.

The complex images after FFT of data collected using a Dixon technique can be written as follows:

$$S_i^{(n)}(x,y) = C^{(n)}(x,y)\{W(x,y) + A^i F(x,y)\} P_0^{(n)} H^i(x,y) \qquad (1)$$

where (x,y) are the spatial coordinates and S is the complex signal after the Fourier transform. The index n refers to coil numbers and may go from 1 to N. The index i refers to the number of Dixon acquisitions. In three-point Dixon, i=0, 1, 2. W and F represent water and fat signal in a given pixel and $C^{(n)}(x,y)$ is the spatial sensitivity of a given coil. A, $P_0^{(n)}$ and H are phasor terms that are defined as follows:

$$A = \exp(j\Delta\omega_0 \tau),$$

$$P_0^{(n)} = \exp(j\phi_0^{(n)}),$$

$$H = \exp(j\Delta\omega\tau), \qquad (2)$$

where $j = \sqrt{-1}$, $\Delta\omega_0$ is the chemical shift of fat and a known constant (approximately 3.35 ppm), $\Delta\omega$ is the (spatially dependent) resonant offset frequency, and $\phi_0^{(n)}$ is a static (meaning it does not change with Dixon timing) but spatially dependent phase term that depends on such factors as RF penetration and data sampling window miscentering.

The challenge in Dixon processing is to determine the above phasor terms, especially H, so that W and F can be unequivocally be determined from Eq. (1). A straightforward way of processing acquired Dixon data from multiple coils is to process data from each coil independently and then to combine the resultant water and fat images at the end. However, such an approach has two obvious drawbacks. First, the processing time becomes proportional to the number of coils N. Since data processing in Dixon imaging is usually quite extensive, the total data processing time may become quite long. Secondly, the SNR of the images from each individual coil is usually limited and images from each coil normally contain regions of very low SNR, which can compromise the reliability and the robustness of the method.

The present invention is a method in which the data from multiple coils is combined for phase error determination. When done appropriately, this approach circumvents the above-mentioned drawback. This method is performed in the following steps. After the collection of k-space data, reconstruct two sets of images for each coil (n=1, 2, N) and each Dixon acquisition (i=0, 1, 2). The two sets of images are reconstructed with two Fermi window filters, one with a window size corresponding to the acquired k-space data size (for example, 128×256), and one with a reduced window size (for example, 64×64 or 96×96). The first set of images are referred to as high resolution images, and the second set of images are of lower-resolution, but higher SNR than the high resolution images.

From the low-resolution images of the first Dixon acquisition (i=0) of each coil (n), first determine the static phasor term $P_0^{(n)}$ as follows:

$$P_0^{(n)} = S_0^{(n)} / abs(S_0^{(n)}) \qquad (3)$$

where abs( ) corresponds to the absolute value operation. Then remove the static phasor term from the images of every Dixon acquisition (i=1 and 2) for each coil (n) by multiplying the complex conjugate of $P_0^{(n)}$ $$S_{0i}^{(n)} = S_0^{(n)} conj(P_0^{(n)}). \qquad (4)$$

Since the coil dependent phase term is eliminated in $S_{0i}^{(n)}$, and the remaining phases are only from resonance offset (H) and the chemical composition (A) of each pixel, the images can be summed over coil index (n) to form the combined images:

$$S_{0i} = \sum_{n=1}^{N} S_{0i}^{(n)} \qquad (5)$$

The images $S_{0i}$ contain all the information on phasor term H, and it has a higher SNR than images from each individual coil. Dixon processing is performed on combined image $S_{0i}$ to determine H. The static phasor term $P_0^{(n)}$ is also calculated as in Eq. (3) for high-resolution images and this phasor term is removed from the high resolution images as in Eq. (4). The resonance offset phasor term H calculated above for low-resolution images is then removed from the high resolution images and separate water and fat images are produced from the resulting correct images for each coil (n). the separate water images from the coils (n) are combined optimally using measured coil noise characteristics. The separate fat images may also be combined to form a single, high SNR fat image.

Description of the Preferred Embodiment

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

Figure 2:
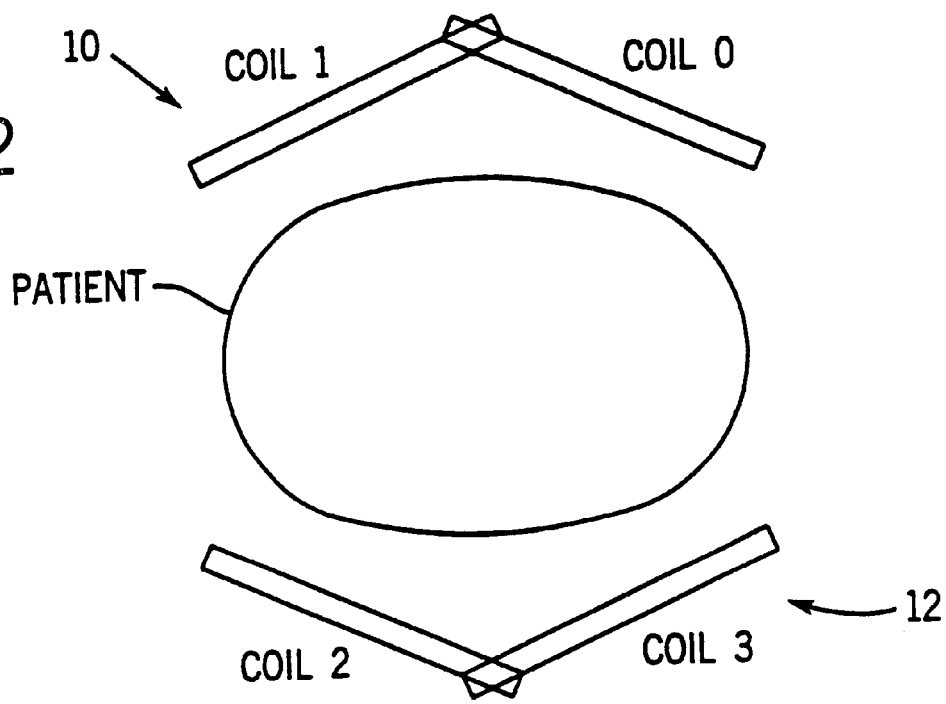
FIG. 2 is a schematic diagram showing the coil elements in a multicoil array disposed around a patient.

A transceiver module 150 in the system control 122 produces pulses which are amplified by an RF amplifier 151 and coupled to the RF coil 152. The resulting signals radiated by the excited spins in the patient may be sensed by the same RF coil 152, but in the preferred embodiment a local coil array indicated at 154 in FIG. 1 and illustrated in FIG. 2 is employed. The local coil array 154 is positioned around the patient anatomy to be imaged and it includes four separate coil elements (not shown in FIG. 1) which receive the NMR signals that are produced during the scan. These NMR signals are separately amplified by pre-amplifiers 153 and applied to the inputs of four separate receivers in the transceiver module 150. The amplified NMR signals are demodulated, filtered, and digitized in the receiver sections of the transceiver 150 to produce four separate k-space data sets.

The local coil array 154 is similar to that disclosed in U.S. Pat. No. 4,825,162. Referring to FIG. 2, each multicoil set consists of two flexible paddles 10 and 12, each with two surface coil elements fabricated with etched copper on a flexible plastic substrate, for a total of four coil elements. Each coil element is a rectangular loop, approximately 12×25 cm. Adjacent elements are overlapped to minimize mutual inductance. The elements are tuned using capacitors distributed around each element, and interface circuitry is added to permit detuning of the element during RF transmission. The coils are positioned anterior and posterior to the imaging volume as depicted in FIG. 2. It should be apparent to those skilled in the art that the present invention is not limited to this particular coil structure, and that it may be used with images acquired with any multi-coil structure.

The NMR signals picked up by the coil array 154 are digitized by the transceiver module 150 and transferred to a memory module 160 in the system control 122. When the image scan is completed the four resulting k-space data sets are processed as will be described in more detail below. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

The following discussion considers a spin echo pulse sequence employed by the above described apparatus and suitable for use with the present invention. It should be understood, however, that the invention may be used with other pulse sequences as will be apparent to one skilled in the art.

Figure 4:
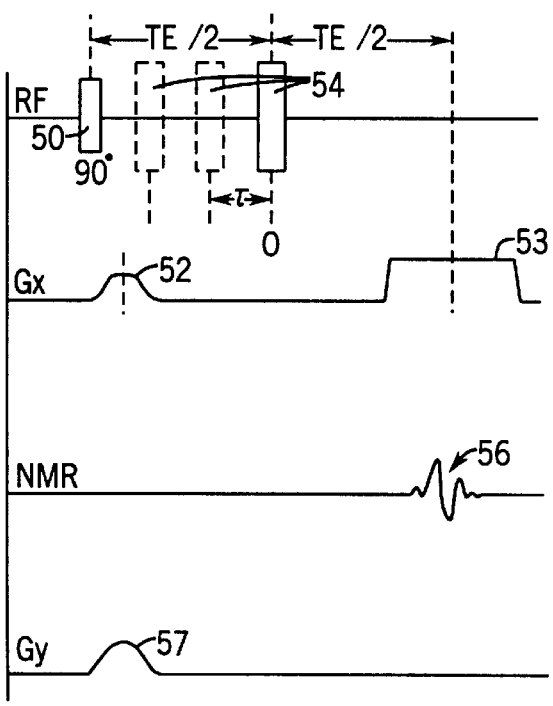
FIG. 4 is a graphic illustration of a pulse sequence employed by the MRI system of FIG. 1 to acquire data.

Referring to FIG. 4, a spin echo pulse sequence begins with the transmission of a narrow bandwidth radio frequency (F) pulse 50. The energy and the phase of this initial RF pulse 50 may be controlled such that at its termination, the magnetic moments of the individual nuclei are precessing around the z axis within the x-y plane. A pulse of such energy and duration is termed a 90° RF pulse.

The result of a combination of RF pulse 50 and a z axis gradient pulse $G_z$ (not shown) is that the nuclear spins of a narrow slice in the imaged object along an x-y plane are excited into resonance. Only those spins with a Larmor frequency, under the combined field $G_z$ and $B_0$, equal to the frequencies of the RF pulse 50 will be excited. Hence the position of the slice may be controlled by the gradient $G_z$ offset or the RF frequency.

After the 90° RF pulse 50 the precessing spins begin to dephase according to their chemical shifts which cause the spins of certain chemical species to precess faster than others and the action of the applied gradients which cause spatially dependent off resonance conditions. At time TE/2 after the application of 90° RF pulse 50, a 180° RF pulse 54 may be applied which as the effect of rephasing the spins to produce a spin echo 56 at time TE after the 90° RF pulse 50. This spin echo signal 56 is acquired during a readout gradient 53. As is understood in the art, a dephaser pulse 52 is applied after the 90° RF pulse but before the readout gradient to center the spin echo within the read out gradient. The spin echo signal 56 is sampled at a rate which determines the resolution of the acquired image along the readout gradient axis. For example, 256 samples are typically acquired.

With the 180° RF pulse 54 centered at time TE/2, any constant off resonance-induced phase shifts, including the chemical shift of fat relative to water, will be completely rephased at the time of the spin echo 56. This timing produces an $S_0$ signal which, consequently, will have no off resonance phase encoding. The time of the 180° pulse 54, however, may be shifted forward to back by time $\tau$ from the time TE/2. In this case, the fat and water proton spins will not be in phase but will be shifted with respect to each other by $2\tau\omega_{cs}$, where $\omega_{cs}$ is the difference in Larmor frequencies between water and fat. The value of the phase shift between the fat and water images caused by their chemical shift will be designated $\theta$. At the same time, any constant resonance offset $\omega_0$ will be phase encoded by an amount $\phi=2\omega\tau$. This sequence is repeated with different $G_y$ gradient pulses 57, as is understood in the art, to acquire a k-space NMR data set from which an image of the imaged object may be reconstructed according to conventional reconstruction techniques using the Fourier transform. The number of separate phase encodings employed in the scan determines image resolution along the phase encoding gradient axis. For example, 128 phase encodings are typically acquired.

In the three point Dixon method, three images $S_i$ are acquired using this pulse sequence. Each image $S_i$ has a different phase shift value $\theta$ between the water and fat components, as follow: $S_0$ where $\theta=0$, $S_1$ where $\theta=\pi/2$, and $S_2$, where $\theta=\pi$.

As indicated above, the four element phase array coil 154 is used to acquire the three k-space data sets $S_0$, $S_1$ and $S_2$. As a result, four sets of such data sets are acquired. These k-space data sets are labeled $S_i^n$, where n indicates the coil element which produced the data set and i indicates the Dixon phase shift applied to the data set. These data sets $S_i^n$ are processed under the direction of a program which is illustrated by the flow chart in FIG. 3 to produce a single water image and a single fat image.

Figure 3:
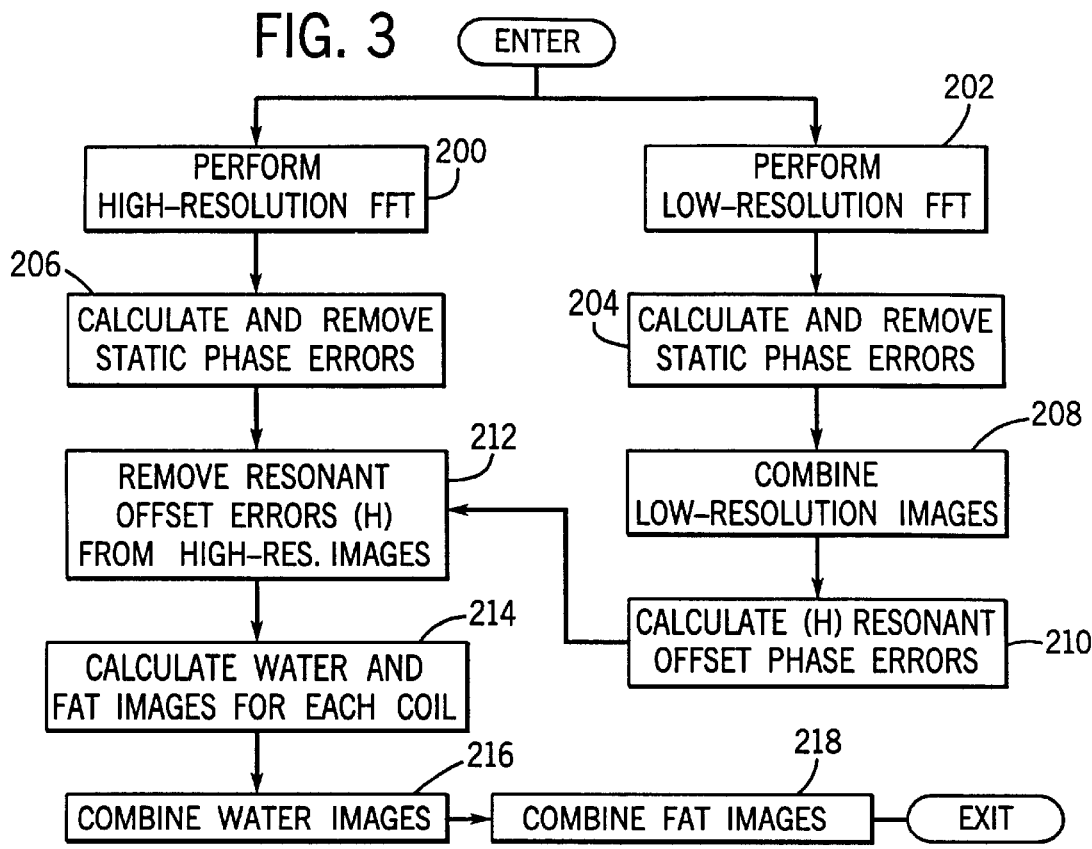
FIG. 3 is a flow chart of the process used to reconstruct an image according to the preferred embodiment of the invention.

Referring particularly to FIG. 3, the first steps in the processing are to separately Fourier transform the acquired k-space data sets $S_i^n$ with two Fermi window filters. The Fermi filter is defined as follows:

$$\text{Fermi} = 1/\{1+\exp[(r-R)/w]\}$$

where:
    r=radius of raw data coordinate relative to the center of the raw data matrix.

R=radius of Fermi filter w=Fermi filter width=10.

One FFT is performed with a high resolution Fermi filter which is set to the maximum resolution of the acquired data (i.e. 128×256). This reconstructs a corresponding set of high resolution images $HS_i^n$ as indicated at process block 200. The other FFT is performed with a low resolution Fermi filter (e.g. 64×64 or 96×96) as indicated at process block 202 to reconstruct a corresponding set of low resolution images $LS_i^n$.

The low resolution images $LS_i^n$ are used to calculate phase corrections. As indicated at process block 204, static phasor term images $LP_0^n$ are calculated using the $\theta=0$ low resolution images $LS_0^n$ and the above Eq. 3, and the low resolution images $LS_i^n$ are then corrected by multiplying each image by the complex conjugate of the static phasor term images $LP_0^n$ as indicated above in Eq. 4. The corresponding corrected low resolution images $LS_0^n$ from each of the n coils are then combined as indicated at process block 208 and in accordance with Eq. 5. As a result of this combination, there are three high SNR, low resolution images at the three Dixon phase shifts. From these three images, a resonance offset phasor image H is calculated as indicated at process block 210. This calculation uses a well known Dixon processing method as described, for example, in U.S. Pat. Nos. 6,016,057 and 6,091,243.

The calculated resonance offset phasor image H is used to correct the high resolution images $HS_i^n$. As indicated at process block 206, the static phase errors are calculated from the high resolution image $HS_0^n$ using equation 3, and the high resolution images $HS_i^n$ are corrected using equation 4. As indicated at process block 212, the high resolution images $HS_i^n$ are then corrected by multiplying each high resolution image $HS_i^n$ by the complex conjugate of the phasor image H:

$$HS_i^n = HS_i^n \text{conj}(H^i).$$

As indicated at process block 214, these corrected high resolution images are then used to calculate a water image and a fat image for each of the N coils. This is done using the well known Dixon technique as described for example, in U.S. Pat. Nos. 6,016,057 and 6,091,243.

The final steps in the process combine the separate coil images. As indicated at process block 216, the N water images are combined using a method such as that described in by P. B. Roemer, et al., "The NMR Phased Array", *Magnetic Resonance In Medicine,* 16, 192–225 (1990) which optimally combines the water images using measured coil noise characteristics. As indicated at process block 218 the N fat images are combined in a similar manner to produce a single high resolution, high SNR fat image. The net result is a single fat image and a single water image which may be separately displayed and stored.

What is claimed is:

1. A method for producing an image of a subject with a magnetic resonance imaging (MRI) system, the steps comprising:

a) acquiring a plurality of image data sets with the MRI system using a corresponding plurality of coils disposed adjacent the subject;

b) reconstructing from the acquired image data sets a corresponding plurality of high resolution images;

c) reconstructing from the acquired image data sets a corresponding plurality of low resolution images;

d) calculating a coil dependent static phase term from the low resolution images;

e) correcting the low resolution images for the static phase error to eliminate a coil dependent phase term;

f) combining the corrected low resolution images;

g) calculating from the combined corrected low resolution images resonance offset phase corrections;

h) calculating a second static phase error for the high resolution images;

i) correcting the high resolution images for the static phase error and correcting the high resolution images using the calculated resonance offset phase corrections calculated in step (g);

j) combining the corrected high resolution images to produce the image of the subject.

2. The method as recited in claim 1 which includes calculating a corresponding plurality of water images from the corrected high resolution images and step j) is performed on the water images.

3. The method as recited in claim 2 in which the water images are calculated using a Dixon technique.

4. The method as recited in claim 1 which includes calculating a corresponding plurality of fat images from the corrected high resolution images and step j) is performed on the fat images.

5. The method as recited in claim 4 in which the fat images are calculated using a Dixon technique.

6. The method as recited in claim 1 in which step b) is performed by Fourier transforming the acquired image data sets with a high resolution filter.

7. The method as recited in claim 6 in which step c) is performed by Fourier transforming the acquired image data sets with a low resolution filter.

8. The method as recited in claim 1 which includes:

calculating a static phase error from the plurality of low resolution images; and correcting the high resolution images using the calculated static phase error.

9. A method for producing an image using a magnetic resonance imaging (MRI) system with an array of NRF coils, the steps comprising:

a) acquiring a first set of N k-space data sets with the MRI system and the N corresponding RF coils using a first pulse sequence in which acquired NMR signals from fat and water spins have a first phase relationship;

b) acquiring a second set of N k-space data sets with the MRI system and the N corresponding RF coils using a second pulse sequence in which acquired NMR signals from fat and water spins have a second phase relationship;

c) reconstructing from the two sets of k-space data sets two corresponding sets of high resolution images;

d) reconstructing two corresponding sets of low resolution images from the two sets of k-space data sets, e) calculating a static phase error from the low resolution images;

f) correcting the low resolution images for static phase error to eliminate a coil dependent phase term;

g) combining the corrected low resolution images;

h) calculating from the combined and corrected low resolution images a resonance offset phase correction;

i) calculating a second static phase error for the high resolution images;

j) correcting the high resolution images for the static phase error; and correcting the high resolution images using the calculated resonance phase offset correction calculated is step (h);

k) producing N images indicative of NMR signals from one of either fat or water spins from the corrected high resolution images; and l) combining the N images produced in step k) to form one image.

10. The method as recited in claim 9 in which step k) employs the Dixon technique.

11. The method as recited in claim 9 in which step c) is performed by Fourier transforming the k-space data sets with a high resolution Fermi filter.

12. The method as recited in claim 11 in which step d) is performed by Fourier transforming the k-space data sets with a low resolution Fermi filter.

13. The method as recited in claim 9 which includes:

calculating a static phase correction from the low resolution images; and correcting the high resolution images using the calculated static phase correction.

* * * * *